United States Patent [19]
Mukaine et al.

[11] Patent Number: 5,514,990
[45] Date of Patent: May 7, 1996

[54] FREQUENCY MULTIPLIER CIRCUIT

[75] Inventors: Kiyoshi Mukaine, Yokohama; Ayako Hirata, Chigasaki; Kazuhiko Kasai, Yokohama, all of Japan

[73] Assignee: Kabushiki Kaisha Toshiba, Kawasaki, Japan

[21] Appl. No.: 363,323

[22] Filed: Dec. 23, 1994

[30]    Foreign Application Priority Data

Dec. 27, 1993  [JP]  Japan ................................. 5-347232

[51] Int. Cl.$^6$ .................................................. H03B 19/00
[52] U.S. Cl. ......................... 327/116; 327/122; 327/158; 327/545; 377/47
[58] Field of Search .................................. 327/113, 114, 327/116, 119, 122, 156, 158, 393, 395, 400; 377/47

[56]            References Cited

U.S. PATENT DOCUMENTS

| | | | |
|---|---|---|---|
| 4,596,954 | 6/1986 | Haque ............................. | 327/116 |
| 4,684,897 | 8/1987 | Richards et al. ................ | 327/113 |
| 4,843,331 | 6/1989 | Yang .............................. | 327/122 |
| 4,859,970 | 8/1989 | Matsuo et al. .................. | 331/57 |
| 4,994,687 | 2/1991 | Fujii et al. ..................... | 327/227 |
| 5,216,301 | 6/1993 | Gleeson, III et al. ............ | 327/395 |
| 5,321,734 | 6/1994 | Ogata ............................ | 327/116 |
| 5,359,635 | 10/1994 | Atriss et al. ................... | 377/47 |

OTHER PUBLICATIONS

"A High Performance VFO–LSI Using 2–micron CMOS Analog and Digital Standard Cel Methodology", S. Fuji et al., Symposium on VLSI Circuits, X–3, pp. 115–116 (1988).

*Primary Examiner*—Timothy P. Callahan
*Assistant Examiner*—My- Trang Nu Ton
*Attorney, Agent, or Firm*—Finnegan, Henderson, Farabow, Garrett & Dunner

[57]            ABSTRACT

An input buffer circuit includes an output circuit and supplies a plurality of signals in response to an input signal. A delay line is constituted of a plurality of delay cells connected in series and delays the signals supplied from the input buffer circuit. A PLL circuit connected to the delay line, includes a level converter which outputs a control signal for controlling a delay time of the delay line. An output signal generation circuit generates a signal having a multiplied frequency from the output signal of the input buffer circuit and the output signal of a tap of the delay line. Each of the delay cells has an output circuit having the same arrangement as that of the output circuit provided in the input buffer circuit, and a clocked inverter circuit included in each of the output circuits of the delay cells and input buffer circuit is controlled by the control signal output from the level converter. Therefore, the waveform of the signal output from the output circuit of the input buffer circuit can be made identical with that of the signal output from the output circuit of each delay cell, and the signal having the multiplied frequency output from the output signal generation circuit has a fixed duty ratio.

3 Claims, 6 Drawing Sheets

FREQUENCY MULTIPLIER CIRCUIT

BACKGROUND OF THE INVENTION

1. Field of the Invention

The present invention relates to a frequency multiplier circuit, such as for communication equipment, applied to a clock generator for generating a clock signal.

2. Description of the Related Art

FIG. 6 shows a prior art multiplier circuit for generating a signal the frequency of which doubles that of an input signal. The multiplier circuit includes an input buffer circuit 11, a delay control circuit 12, an exclusive OR circuit (referred to as an Ex-OR hereinafter) 13 serving as an output signal generation circuit 19. In response to an input signal fin, the input buffer circuit 11 supplies signals Sd and Sp to the delay control circuit 12 and signal Se to the Ex-OR 13.

The delay control circuit 12 is constituted by a PLL (phase locked loop) circuit including a delay line 14, a phase comparator 15, a charge pump circuit 16, an LPF (low-pass filter) 17, and a level converter 18. The total delay time of the delay line 14 is controlled by the PLL circuit so as to correspond to half the cycle of the input signal fin. This type of delay control circuit is described in detail in S. Fujii et al., "A High Performance VFO-LSI Using 2-micron CMOS Analog and Digital Standard Cell Methodology," Symposium on VLSI Circuits X-3, pp. 115–116, 1988. The delay line 14 is constituted of a plurality of delay cells DC connected in series. Each of the delay cells DC includes, for example, a clocked inverter circuit and an output circuit for outputting an output signal of the clocked inverter circuit.

The Ex-OR 13 is supplied with signal Se output from the input buffer circuit 11 and signal Sed output from a tap of the delay line 14, and the output terminal thereof outputs a signal fout the frequency of which doubles the input signal fin. Since the circuit shown in FIG. 6 is a doubler circuit, if the delay line 14 is constituted of n delay cells DC, the tap is provided at the (n/2)-th delay cell.

FIG. 7 shows the input buffer circuit 11. As shown in FIG. 7, the input signal fin is supplied to an inverter circuit 11a, and an output signal of the circuit 11a is supplied to an output circuit 11b. The output circuit 11b includes an inverter circuit 11e having a PMOS transistor (referred to a PMOS hereinafter) 11c and an NMOS transistor (referred to as an NMOS) 11d, and inverter circuits 11f, 11g and 11h connected to an output terminal of the inverter circuit 11e. The signal Sd is output from the output terminal of the inverter circuit 11e. The inverter circuits 11f and 11g are connected in series to the output terminal of the inverter circuit 11e. The signal Se is output from the output terminal of the inverter circuit 11g. The inverter circuit 11h is connected to the output terminal of the inverter circuit 11f. The signal Sp is output from the inverter circuit 11h.

FIG. 8 illustrates one of the delay cells DC described above. The delay cell includes a clocked inverter circuit 14a and an output circuit 14b connected to the inverter circuit 14a. In the clocked inverter circuit 14a, a signal In (Sd or Sdd), which is supplied from its preceding stage, is supplied to the gates of a PMOS 14c and NMOS 14d. The drains of the PMOS 14c and NOMS 14d are connected to each other. An NMOS 14e is connected between the source of the NOMS 14d and the ground, and the gate of the NMOS 14e is supplied with a signal Nv output from the level converter 18. A PMOS 14f is connected between the source of the PMOS 14c and a power supply Vcc, and the gate of the PMOS 14f is supplied with a signal Pv output from the level converter 18.

The output circuit 14b includes a clocked inverter circuit 14g and inverter circuits 14l, 14m and 14n. In the clocked inverter circuit 14g, the gates of PMOS 14h and NOMS 14i are connected to the drains of the PMOS 14c and NOMS 14d. The drains of the PMOS 14h and NMOS 14i are connected to each other. An NMOS 14j is connected between the source of the NMOS 14i and the ground, and the gate of the NMOS 14j is supplied with the signal Nv output from level converter 18. A PMOS 14k is connected between the source of the PMOS 14h and a power supply Vcc, and the gate of the PMOS 14k is supplied with the signal Pv output from the level converter 18.

The signal Sdd is output from the output terminal of the clocked inverter circuit 14g, and the inverter circuits 14l and 14m are connected in series to the output terminal of the circuit 14g. The signal Sed is output through the inverter circuits 14l and 14m. The inverter circuit 14n is connected to the output terminal of the inverter circuit 14l and outputs the signal Spd.

It is evident from the above that the output circuit 11b of the input buffer circuit 11 and the output circuit 14b of the delay cell DC differ in circuit arrangement. Thus the signal Se output from the input buffer circuit 11 and the signal Sed output from the delay cell DC differ in waveform from each other, as shown in FIG. 9. The difference in waveform becomes greater due to errors in manufacture process and variations in power supply voltage or ambient temperature. The Ex-OR 13 is supplied with these signals Se and Sed. Therefore, as shown in FIG. 9, the output signal fout of the Ex-OR 13 causes an error DE on the duty ratio, with the result that it is likely that the duty ratio will not attain 50% and a jitter varying the duty ratio will occur.

SUMMARY OF THE INVENTION

An object of the present invention is to provide a multiplier circuit capable of maintaining a fixed duty ratio and preventing a jitter from occurring, without being influenced by errors in manufacture process or variations in power supply voltage or ambient temperature.

To attain the above object, there is provided a multiplier circuit comprising:

input means for receiving an input signal, the input means supplying a plurality of signals in response to the input signal;

delay means including a plurality of delay cells each having a first output circuit, each of the delay cells delaying a signal supplied from the input means for a predetermined time, and outputting the signal from the first output circuit;

control means connected to the delay means, for supplying a control signal to the delay cells and controlling a delay time; and output signal generation means connected to the input means and the delay means, the output signal generation means being supplied with the signal delayed by the delay means and the signals supplied from the input means to generate a signal whose frequency is a multiple of a frequency of each of the signals, wherein the input means includes a second output circuit whose arrangement is equal to an arrangement of the first output circuit, and the second output circuit is supplied with the control signal from the control means and controlled together with the first output circuit.

According to the above multiplier circuit, the input means includes an output circuit having the same circuit arrangement as that of the output circuit of each of the delay cell, and these output circuits are controlled by the control means. Therefore, the waveform of the signal output from the output circuit of the input means and that of the signal output from the output circuit of the delay cell can be made identical with each other, with the result that a fixed duty ratio of a signal having a multiplied frequency can be maintained without being influenced by errors in manufacture process or variations in power supply voltage and ambient temperature.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described, with reference to the accompanying drawings.

Figure 1:
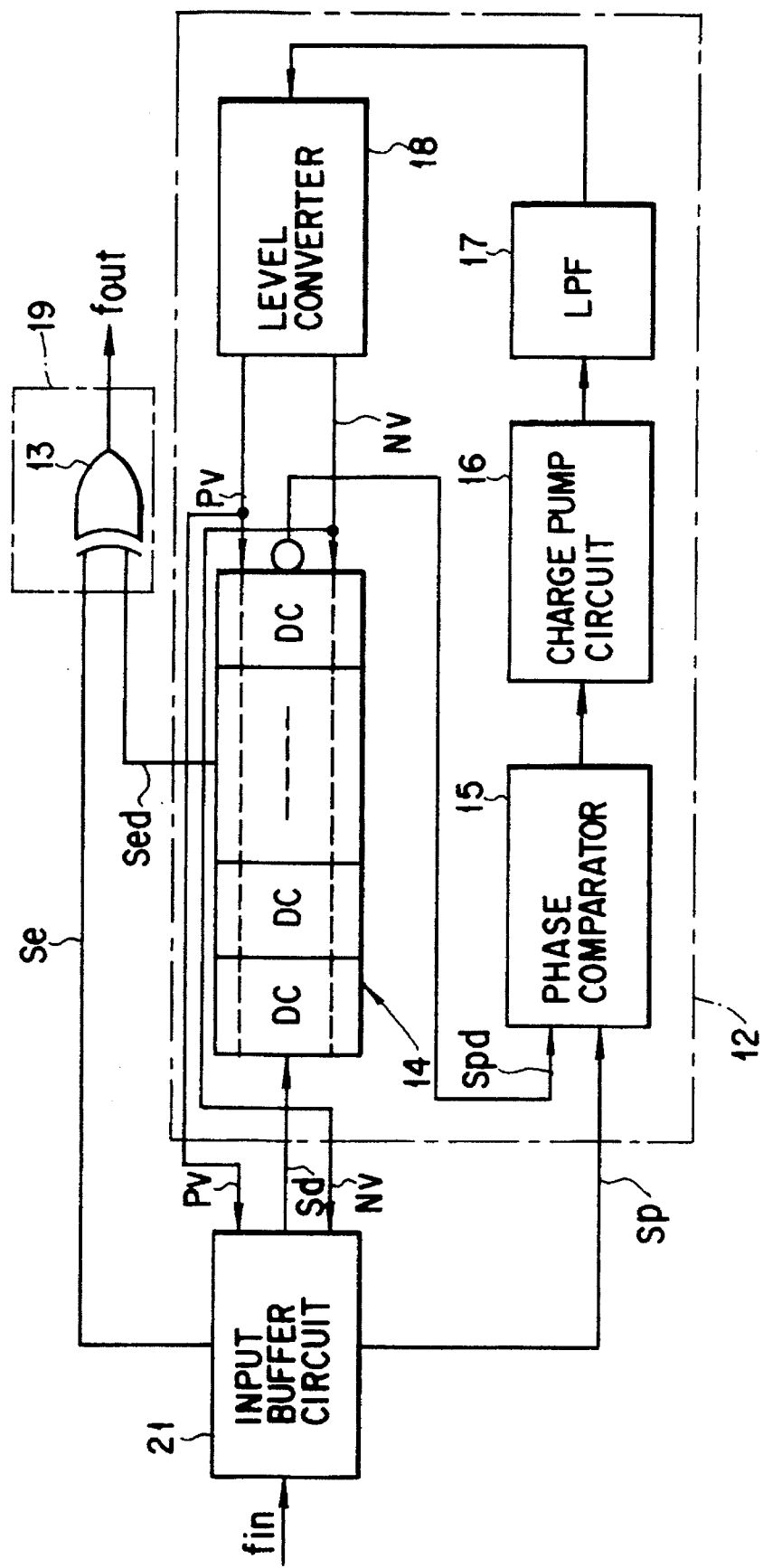
FIG. 1 is a block diagram showing a multiplier circuit according to a first embodiment of the present invention.
Figure 6:
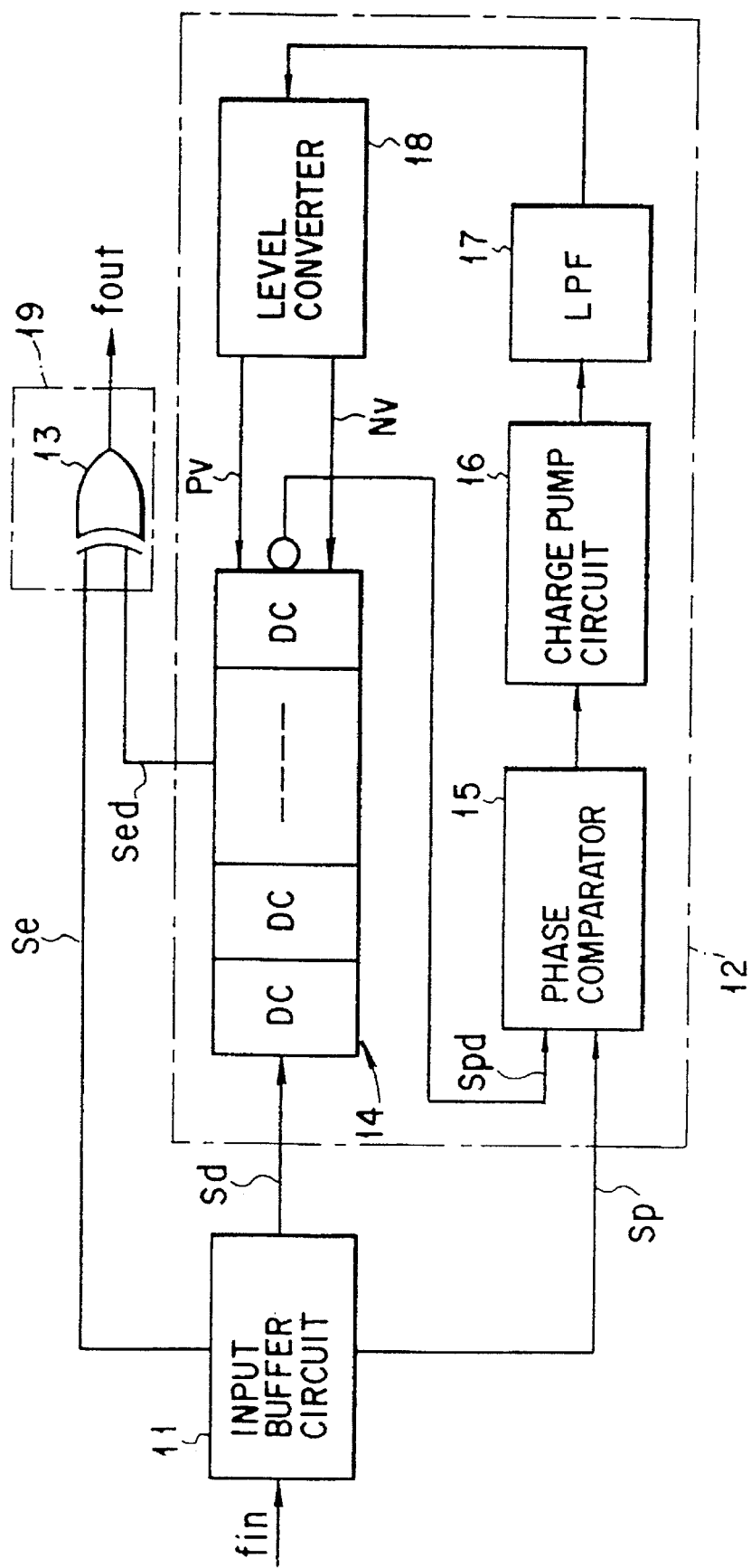
FIG. 6 is a block diagram showing a prior art multiplier circuit.
Figure 8:
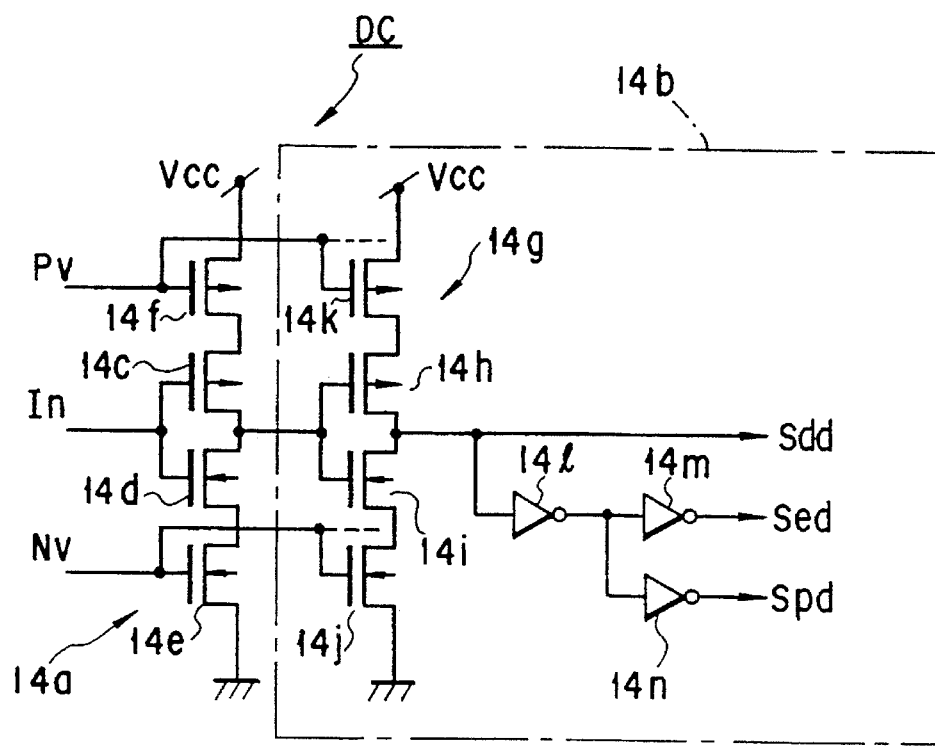
FIG. 8 is a circuit diagram showing an example of a delay cell of the prior art multiplier circuit of FIG. 6.
Figure 9:
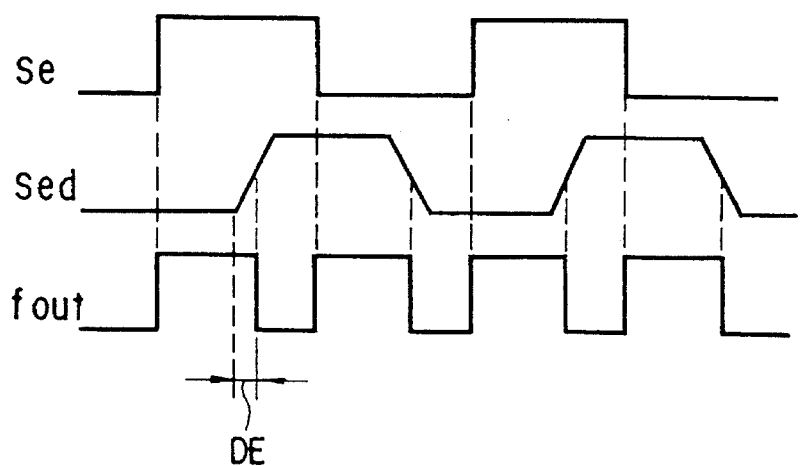
FIG. 9 is a view of waveforms showing an operation of the circuit of FIG. 6.

FIG. 1 shows a multiplier circuit according to the first embodiment of the present invention. In FIG. 1, the same constituent elements as those of FIG. 6 are denoted by the same reference numerals.

The multiplier circuit shown in FIG. 1 generates a signal the frequency of which doubles that of an input signal, and includes an input buffer circuit 21, a delay control circuit 12, and an Ex-OR 13 serving as an output signal generation circuit 19. The input buffer circuit 21 supplies signals Sd and Sp to the delay control circuit 12 and a signal Se to the Ex-OR 13 in response to an input signal fin. The input buffer circuit 21 is supplied with signals Pv and Nv output from a level converter 18.

The delay line 14 includes a plurality of delay cells DC connected in series, and delays the signal Sd output from the input buffer circuit 21. A phase comparator 15, a charge pump circuit 16, a low-pass filter 17, and the level converter 18 constitute a PLL circuit. The PLL circuit controls the delay line 14 so that the total delay time of the delay line corresponds to half the cycle of the input signal.

The phase comparator 15 is connected to the delay line 14 and input buffer circuit 21 to compare the phase of signal Spd output from the delay line 14 and that of signal Sp output from the input buffer circuit 21. The charge pump circuit 16 is connected to the output terminal of the phase comparator 15, and the low-pass filter 17 is then connected to the circuit 16, and these circuits 16 and 17 convert the output signal of the comparator 15 into a voltage. The level converter 18 is connected to the output terminal of the low-pass filter 17 to convert the level of the output signal of the filter 17 and generate opposite signals Pv and Nv. These signals Pv and Nv are supplied to the delay cells DC to control the delay time of the delay line 14, and are also supplied to the input buffer circuit 21 to control the operation thereof.

The Ex-OR 13 is supplied with signal Se from the input buffer circuit 21 and signal Sed from a tap of the delay line 14, and outputs from the output terminal a signal fout the frequency of which doubles that of the input signal fin. Since the circuit of the first embodiment is a doubler circuit, if the delay line 14 is constituted of n delay cells DC, the tap is provided at the (n/2)-th delay cell.

Figure 2:
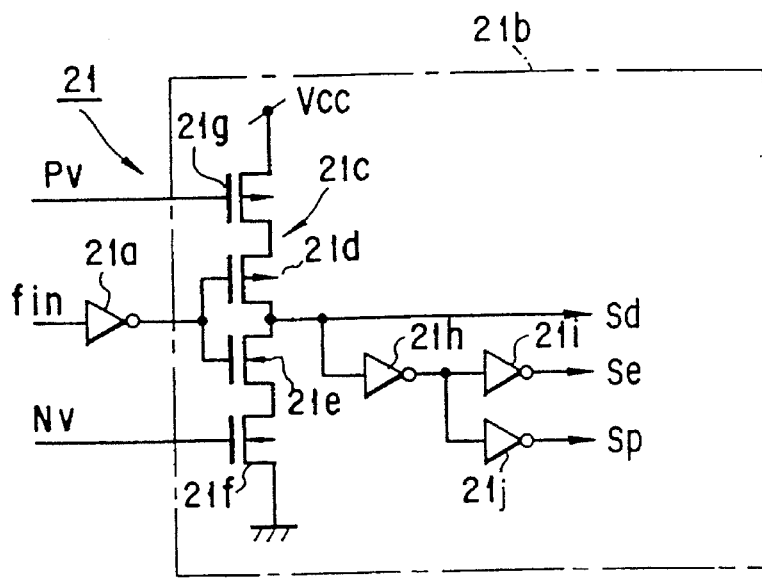
FIG. 2 is a circuit diagram showing an example of an input buffer circuit of the circuit shown in FIG. 1.

FIG. 2 depicts the input buffer circuit 21. The circuit 21 includes an inverter circuit 21a an input terminal of which is supplied with an input signal fin, and an output circuit 21b connected to the output terminal of the inverter circuit 21a.

The output circuit 21b includes a clocked inverter circuit 21c and inverter circuits 21h, 21i and 21j. In the clocked inverter circuit 21c, the gates of a PMOS 21d and an NMOS 21e are connected to the output terminal of the inverter circuit 21a, whereas the drains thereof are connected to each other. An NMOS 21f is connected between the source of the NMOS 21e and the ground, and the gate of the NMOS 21f is supplied with the signal Nv from the level converter 18. A PMOS 21g is connected between the source of the PMOS 21d and a power supply Vcc, and the gate of the PMOS 21g is supplied with the signal Pv from the level converter 18.

The signal Sd is output from the output terminal of the clocked inverter circuit 21c, and the inverter circuits 21h and 21i are connected in series to the output terminal of the inverter circuit 21c. The signal Se is output from the output terminal of the inverter circuit 21i. An inverter circuit 21j is connected to the output terminal of the inverter circuit 21h, and the signal Sp is output from the output terminal of the inverter circuit 21j.

Figure 3:
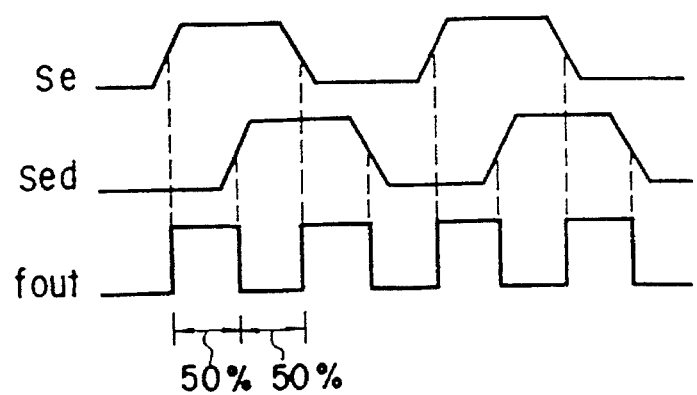
FIG. 3 is a view of waveforms showing an operation of the circuit of FIG. 1.

As described above, the output circuit 21b of the input buffer circuit 21 and the output circuit 14b of the delay cell DC have the same arrangement. Therefore, as shown in FIG. 3, the waveform of signal Se output from the input buffer circuit 21 and that of signal Sed output from the output circuit of the delay cell DC are equal to each other, with the result that the output signal fout of the Ex-OR 13 supplied with the signals Se and Sed has a fixed duty ratio of 50%.

Since, furthermore, the output circuit 21b and output circuit 14b have the same arrangement, the multiplier circuit of the first embodiment is not influenced so greatly by errors in manufacture process or variations in power supply voltage and ambient temperature, but is capable of preventing a jitter from occurring.

Figure 4:
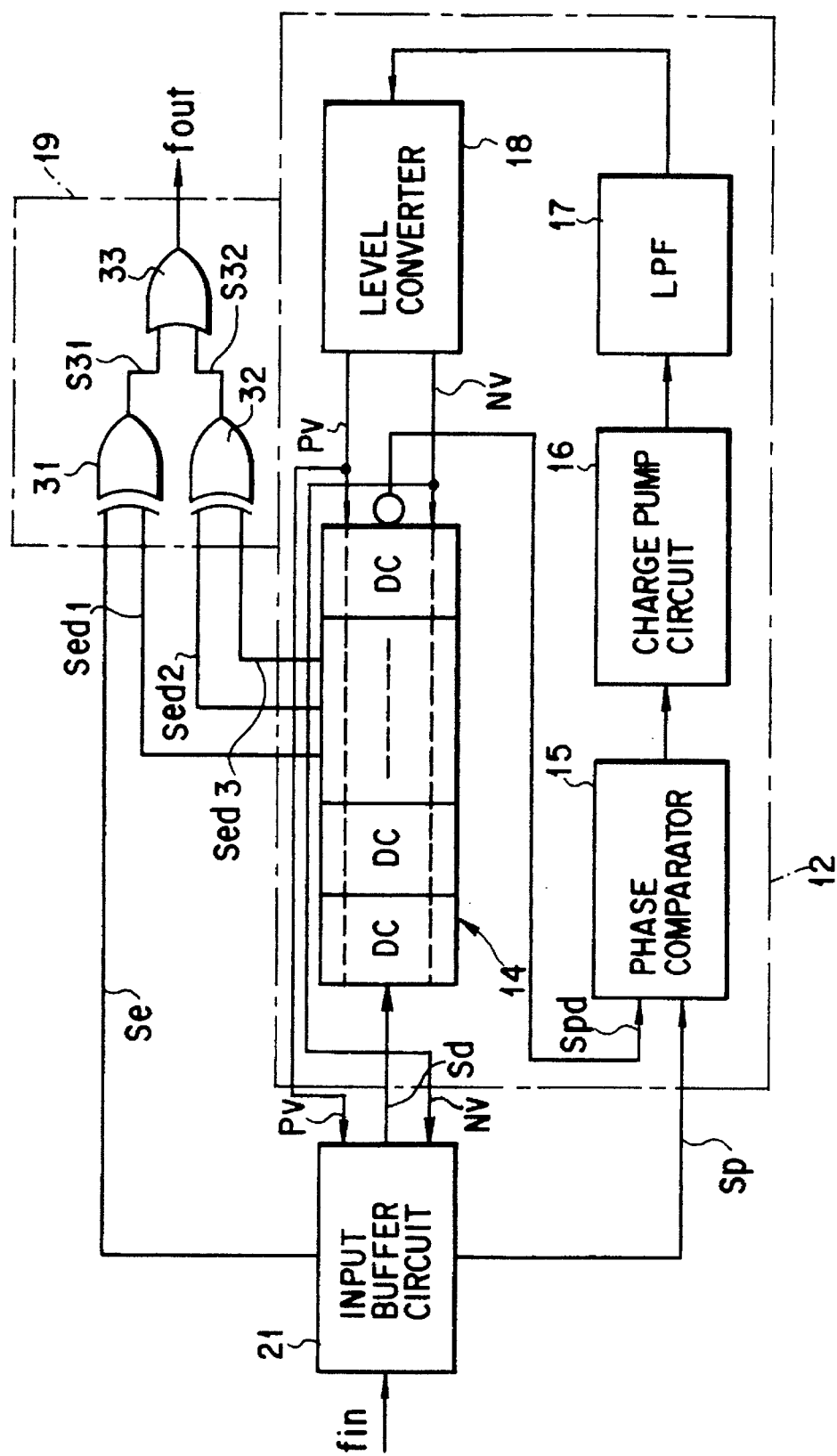
FIG. 4 is a block diagram showing a multiplier circuit according to a second embodiment of the present invention.

FIG. 4 shows a multiplier circuit according to the second embodiment of the present invention. The multiplier circuit shown in FIG. 4 generates a signal the frequency of which quadruples that of an input signal. In FIG. 4, the same constituent elements as those of FIG. 1 are represented by the same reference numerals.

According to the second embodiment, an output signal generation circuit 19 has Ex-ORs 31 and 32 and an OR circuit 33 in place of the Ex-OR 13 of the first embodiment. While one input terminal of the Ex-OR 31 is supplied with an output signal Se of an input buffer circuit 21, the other input terminal thereof is supplied with a signal Sed1 from the (n/4)-th delay cell of n delay cells. Furthermore, while one input terminal of the Ex-OR 32 is supplied with a signal Sed2 from the (n/2)-th delay cell, and the other input terminal thereof is supplied with a signal Sed3 from the (3n/4)-th delay cell. The output signals S31 and S32 of the Ex-ORs 31 and 32 are supplied to the input terminals of the OR circuit 33, and the OR circuit 33 output an output signal fout from the output terminal.

Figure 5:
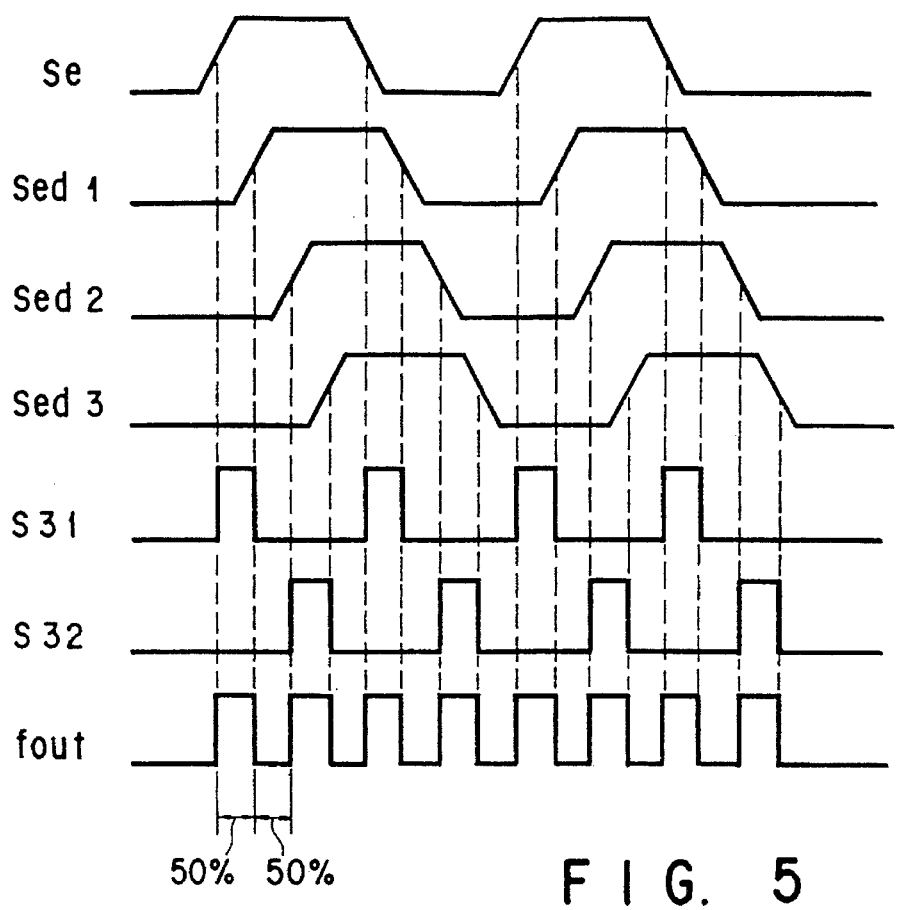
FIG. 5 is a view of waveforms showing an operation of the circuit of FIG. 4.
Figure 7:
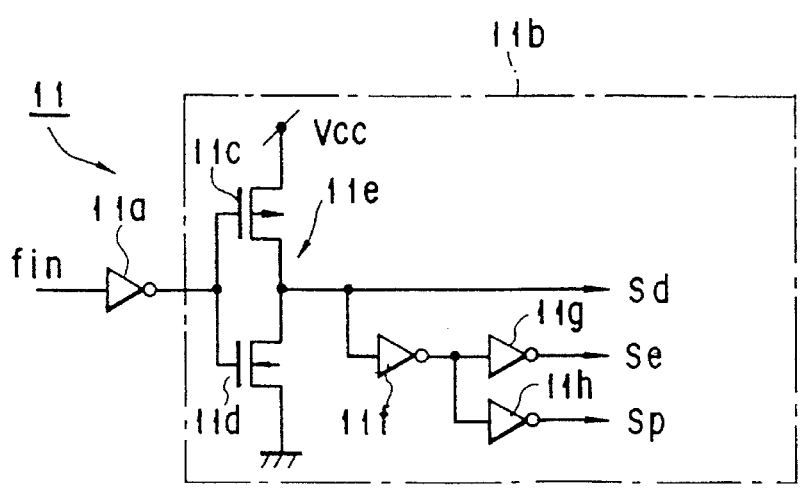
FIG. 7 is a circuit diagram showing an example of an input buffer circuit of the prior art multiplier circuit of FIG. 6.

FIG. 5 shows waveforms of the signals output from the circuits shown in FIG. 4. As is apparent from FIG. 5, according to the second embodiment, the duty ratio is fixed at 50%, and a signal having a quadrupled frequency, which prevents a jitter from occurring, can be generated.

In the foregoing first and second embodiments, the Ex-OR is used for the output signal generation circuit 19. The present invention is not limited to this. The Ex-OR can be replaced with an exclusive NOR circuit.

What is claimed is:

1. A multiplier circuit comprising:

an input circuit supplied with an input signal, said input circuit including a first output circuit for outputting first to third signals in response to the input signal;

a delay circuit having a plurality of delay cells each having a second output circuit, each of said delay cells delaying the first signal supplied from said input circuit for a predetermined time, and outputting a signal from said second output circuit;

a phase comparator circuit connected to said input circuit and said delay circuit, for comparing a phase of the signal output from said delay circuit and a phase of the second signal output from said input circuit thereby to output a voltage corresponding to a difference in phase between the signals;

a level converter circuit connected to said phase comparator circuit, for converting a level of the voltage output from said phase comparator and generating a control signal for controlling a delay time of each of said delay cells; and an output signal generation circuit connected to said input circuit and at least one tap of said delay circuit, for generating a signal having a multiplied frequency from a signal output from said at least one tap of said delay circuit and the third signal output from said input circuit, said first and second output circuits each including a clocked inverter circuit controlled by the control signal generated from said level converter circuit.

2. A circuit according to claim 1, wherein said clocked inverter circuit comprises:

first and second transistors having gates connected to each other and drains connected to each other, the gates of said first and second transistors receiving an input signal, and the drains thereof supplying an output signal;

a third transistor having a current path connected between a source of said first transistor and a first power supply and a gate supplied with a first control signal from said level converter circuit; and a fourth transistor having a current path connected between a source of said second transistor and a second power supply and a gate supplied with a second control signal from said level converter circuit.

3. A multiplier circuit comprising:

an input circuit supplied with an input signal, said input circuit including a first output circuit for outputting first to third signals in response to the input signal;

a delay circuit having a plurality of delay cells each having a second output circuit, each of said delay cells delaying the first signal supplied from said input circuit for a predetermined time, and outputting a signal from said second output circuit;

a phase comparator circuit connected to said input circuit and said delay circuit, for comparing a phase of the signal output from said delay circuit and a phase of the second signal output from said input circuit thereby to output a voltage corresponding to a difference in phase between the signals;

a level converter circuit connected to said phase comparator circuit, for converting a level of the voltage output from said phase comparator and generating first and second control signals for controlling a delay time of each of said delay cells;

an output signal generation circuit connected to said input circuit and at least one tap of said delay circuit, for generating a signal having a multiplied frequency from a signal output from said at least one tap of said delay circuit and the third signal output from said input circuit; and a clocked inverter circuit included in each of said first and second output circuits, said clocked inverter circuit including:

first and second transistors having gates connected to each other and drains connected to each other, the gates of said first and second transistors receiving the input signal, and the drains thereof supplying an output signal;

a third transistor having a current path connected between a source of said first transistor and a first power supply and a gate supplied with the first control signal from said level converter circuit; and a fourth transistor having a current path connected between a source of said second transistor and a second power supply and a gate supplied with the second control signal from said level converter circuit.

* * * * *